(12) United States Patent
Konegawa et al.

(10) Patent No.: US 12,282,200 B2
(45) Date of Patent: Apr. 22, 2025

(54) OPTICAL ELEMENT-INCLUDING OPTO-ELECTRIC HYBRID BOARD

(71) Applicant: NITTO DENKO CORPORATION, Osaka (JP)

(72) Inventors: Naoto Konegawa, Osaka (JP); Kazuaki Suzuki, Osaka (JP); Shinya Ota, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 260 days.

(21) Appl. No.: 17/442,353

(22) PCT Filed: Mar. 19, 2020

(86) PCT No.: PCT/JP2020/012404
§ 371 (c)(1),
(2) Date: Sep. 23, 2021

(87) PCT Pub. No.: WO2020/203366
PCT Pub. Date: Oct. 8, 2020

(65) Prior Publication Data
US 2022/0179160 A1    Jun. 9, 2022

(30) Foreign Application Priority Data
Mar. 29, 2019 (JP) .................................. 2019-066192

(51) Int. Cl.
*G02B 6/43* (2006.01)
*G02B 6/12* (2006.01)
*H01S 5/0239* (2021.01)

(52) U.S. Cl.
CPC ................. *G02B 6/43* (2013.01); *G02B 6/12* (2013.01); *H01S 5/0239* (2021.01)

(58) Field of Classification Search
None
See application file for complete search history.

(56) References Cited

U.S. PATENT DOCUMENTS 7,256,059 B2 *   8/2007   Lu ........................ G02B 6/4214
                                               257/E21.503
7,444,058 B2 *  10/2008   Nonaka ................ H05K 1/0274
                                               385/14
(Continued)

FOREIGN PATENT DOCUMENTS

CN      103837932 A     6/2014
JP      2004-533009 A  10/2004
(Continued)

OTHER PUBLICATIONS

Office Action, which was issued by the Japanese Patent Office on Feb. 7, 2023, in connection with Japanese Patent Application No. 2019-066192.

(Continued)

*Primary Examiner* — Rhonda S Peace
(74) *Attorney, Agent, or Firm* — Edwards Neils LLC; Jean C. Edwards, Esq.

(57) ABSTRACT

An optical element-including opto-electric hybrid board includes an opto-electric hybrid board including an optical waveguide and an electric circuit board in order toward one side in a thickness direction, an optical element mounted on the electric circuit board at one side in the thickness direction of the opto-electric hybrid board, and a bonding member interposed between the optical element and the electric circuit board so as to bond the optical element to the electric circuit board. A thermal expansion coefficient of the bonding member is 80 ppm or less.

5 Claims, 2 Drawing Sheets

(56) References Cited

U.S. PATENT DOCUMENTS

| | | | |
|---|---|---|---|
| 9,116,292 B2* | 8/2015 | Fujiwara | G02B 6/4214 |
| 9,632,263 B2* | 4/2017 | Shibata | G02B 6/42 |
| 10,018,781 B1* | 7/2018 | Masuda | G02B 6/4249 |
| 2002/0146195 A1* | 10/2002 | Hsu | G02B 6/3582 385/16 |
| 2003/0201462 A1 | 10/2003 | Pommer et al. | |
| 2004/0017215 A1 | 1/2004 | Mule et al. | |
| 2004/0266062 A1 | 12/2004 | Lu et al. | |
| 2005/0105860 A1 | 5/2005 | Oono et al. | |
| 2007/0147767 A1* | 6/2007 | Nonaka | H05K 1/0274 385/142 |
| 2008/0310848 A1 | 12/2008 | Yasuda et al. | |
| 2009/0180732 A1* | 7/2009 | Takai | G02B 6/42 264/1.7 |
| 2011/0013865 A1 | 1/2011 | Shibata et al. | |
| 2011/0080657 A1* | 4/2011 | Takai | G02B 6/4206 359/742 |
| 2014/0147076 A1 | 5/2014 | Tsujita et al. | |
| 2014/0290850 A1* | 10/2014 | Yamakami | G02B 6/4239 156/362 |
| 2015/0147023 A1 | 5/2015 | Yamamoto | |
| 2016/0116690 A1* | 4/2016 | Tanaka | G02B 6/1221 385/14 |
| 2018/0011264 A1* | 1/2018 | Uchiyama | G02B 6/4204 |
| 2018/0239095 A1* | 8/2018 | Wade | H10D 62/115 |
| 2022/0179160 A1* | 6/2022 | Konegawa | G02B 6/12 |

FOREIGN PATENT DOCUMENTS

| | | | | |
|---|---|---|---|---|
| JP | 2005077644 A | * | 3/2005 | G02B 6/43 |
| JP | 2008-310066 A | | 12/2008 | |
| JP | 2009-080451 A | | 4/2009 | |
| JP | 2009-163178 A | | 7/2009 | |
| JP | 2011-043535 A | | 3/2011 | |
| JP | 2011-081071 A | | 4/2011 | |
| JP | 2013-127528 A | | 6/2013 | |
| JP | 2015-102648 A | | 6/2015 | |
| TW | 200622330 A | | 7/2006 | |
| WO | 02/093696 A2 | | 11/2002 | |
| WO | 2012/133557 A1 | | 10/2012 | |

OTHER PUBLICATIONS

International Preliminary Report on Patentability issued by WIPO on Sep. 28, 2021, in connection with International Patent Application No. PCT/JP2020/012404.

Office Action, which was issued by the Japanese Patent Office on May 23, 2023, in connection with Japanese Patent Application No. 2019-066192.

International Search Report Issued in PCT/JP2020/012404 on Jun. 9, 2020.

Written Opinion Issued in PCT/JP2020/012404 on Jun. 9, 2020.

Office Action, which was issued by the Taiwanese Patent Office on Jan. 3, 2024, in connection with Taiwanese Patent Application No. 109110028.

Office Action, which was issued by the Korean Intellectual Property Office, 2024, on Nov. 8, 2024, in connection with Korean Patent Application No. 10-2021-7030251.

Office Action, issued by the State Intellectual Property Office of China on Jan. 22, 2025, in connection with Chinese Patent Application No. 202080026187.6.

* cited by examiner

OPTICAL ELEMENT-INCLUDING OPTO-ELECTRIC HYBRID BOARD

CROSS-REFERENCE TO RELATED APPLICATIONS

The present application is a 35 U.S.C. 371 National Stage Entry of: PCT/JP2020/012404, filed on Mar. 19, 2020, which claims priority from Japanese Patent Application No. 2019-066192, filed on Mar. 29, 2019, the contents of all of which are herein incorporated by reference in their entirety.

TECHNICAL FIELD

The present invention relates to an optical element-including opto-electric hybrid board.

BACKGROUND ART

An optical element-including opto-electric hybrid board including an opto-electric hybrid board, an optical element mounted thereon, and an underfill resin interposed therebetween has been known (ref: for example, Patent Document 1 below). The underfill resin of Patent Document 1 bonds the opto-electric hybrid board to the optical element.

CITATION LIST

Patent Document

Patent Document 1: Japanese Unexamined Patent Publication No. 2015-102648

SUMMARY OF THE INVENTION

Problem to be Solved by the Invention

However, in the optical element-including opto-electric hybrid board described in Patent Document 1, a high temperature based on the heat generation of the optical element may be generated in the underfill resin and its vicinity. In that case, the mechanical strength of the underfill resin and its vicinity is likely to decrease, and also, due to this, the electrical connection reliability of the optical element and an electric circuit board may decrease.

The present invention provides an optical element-including opto-electric hybrid board capable of suppressing a decrease in the mechanical strength of a bonding member at a high temperature, and capable of suppressing a decrease in the electrical connection reliability of an optical element and an electric circuit board.

Means for Solving the Problem

The present invention (1) includes an optical element-including opto-electric hybrid board including an opto-electric hybrid board including an optical waveguide and an electric circuit board in order toward one side in a thickness direction, an optical element mounted on the electric circuit board at one side in the thickness direction of the opto-electric hybrid board, and a bonding member interposed between the optical element and the electric circuit board so as to bond the optical element to the electric circuit board, wherein a thermal expansion coefficient of the bonding member is 80 ppm or less.

In the optical element-including opto-electric hybrid board, since the thermal expansion coefficient of the bonding member is 80 ppm or less, it is possible to suppress a decrease in the mechanical strength of the bonding member at a high temperature based on the heat generation of the optical element, and to suppress a decrease in the electrical connection reliability.

The present invention (2) includes the optical element-including opto-electric hybrid board described in (1), wherein the thermal expansion coefficient of the bonding member is 10 ppm or more.

In the optical element-including opto-electric hybrid board, since the thermal expansion coefficient of the bonding member is 10 ppm or more, it is possible to decrease the stress applied to the bonding member.

The present invention (3) includes the optical element-including opto-electric hybrid board described in (1) or (2), wherein a material for the bonding member has the viscosity at 25° C. of 0.1 Pa·s or more and 10 Pa·s or less.

Further, in the optical element-including opto-electric hybrid board, since the material for the bonding member has the viscosity at 25° C. of 10 Pa·s or less, it is possible to smoothly and reliably pour the material between the optical element and the electric circuit board, and thus, to suppress a decrease in the mechanical strength of the bonding member. Further, since the viscosity at 25° C. of the material is 0.1 Pa·s or more, it is possible to suppress the flowing of the material to the outside of the optical element to contaminate its periphery.

The present invention (4) includes the optical element-including opto-electric hybrid board described in any one of (1) to (3), wherein a tensile elastic modulus at 25° C. of the bonding member is 0.5 GPa or more and 15 GPa or less.

Furthermore, in the optical element-including opto-electric hybrid board, since the tensile elastic modulus at 25° C. of the bonding member is 0.5 GPa or more, it is possible to suppress a decrease in the mechanical strength of the bonding member, and thus, to suppress a decrease in the electrical connection reliability of the optical element and the electric circuit board. On the other hand, since the tensile elastic modulus at 25° C. of the bonding member is 15 GPa or less, the bonding member has excellent toughness.

The present invention (5) includes the optical element-including opto-electric hybrid board described in any one of (1) to (4), wherein a glass transition temperature of the bonding member is above 85° C.

Further, since the glass transition temperature of the bonding member is above the above-described 85° C., the bonding member can suppress a decrease in the mechanical strength of the bonding member at a high temperature based on the heat generation of the optical element.

The present invention (6) includes the optical element-including opto-electric hybrid board described in any one of (1) to (5), wherein the bonding member is a cured product obtained by heating of the material, or a cured product obtained by heating of the material and by application of an active energy ray.

In the optical element-including opto-electric hybrid board, it is possible to form a bonding member in a short time by heating of the material, or by heating and application of the active energy ray.

Effect of the Invention

In the optical element-including opto-electric hybrid board of the present invention, since the thermal expansion coefficient of the bonding member is 80 ppm or less, it is possible to suppress a decrease in the mechanical strength of the bonding member at a high temperature based on the heat generation of the optical element, and to suppress a decrease in the electrical connection reliability.

DESCRIPTION OF EMBODIMENTS

One Embodiment

One embodiment of an optical element-including opto-electric hybrid board of the present invention is described with reference to FIGS. 1 to 2.

Figure 1:
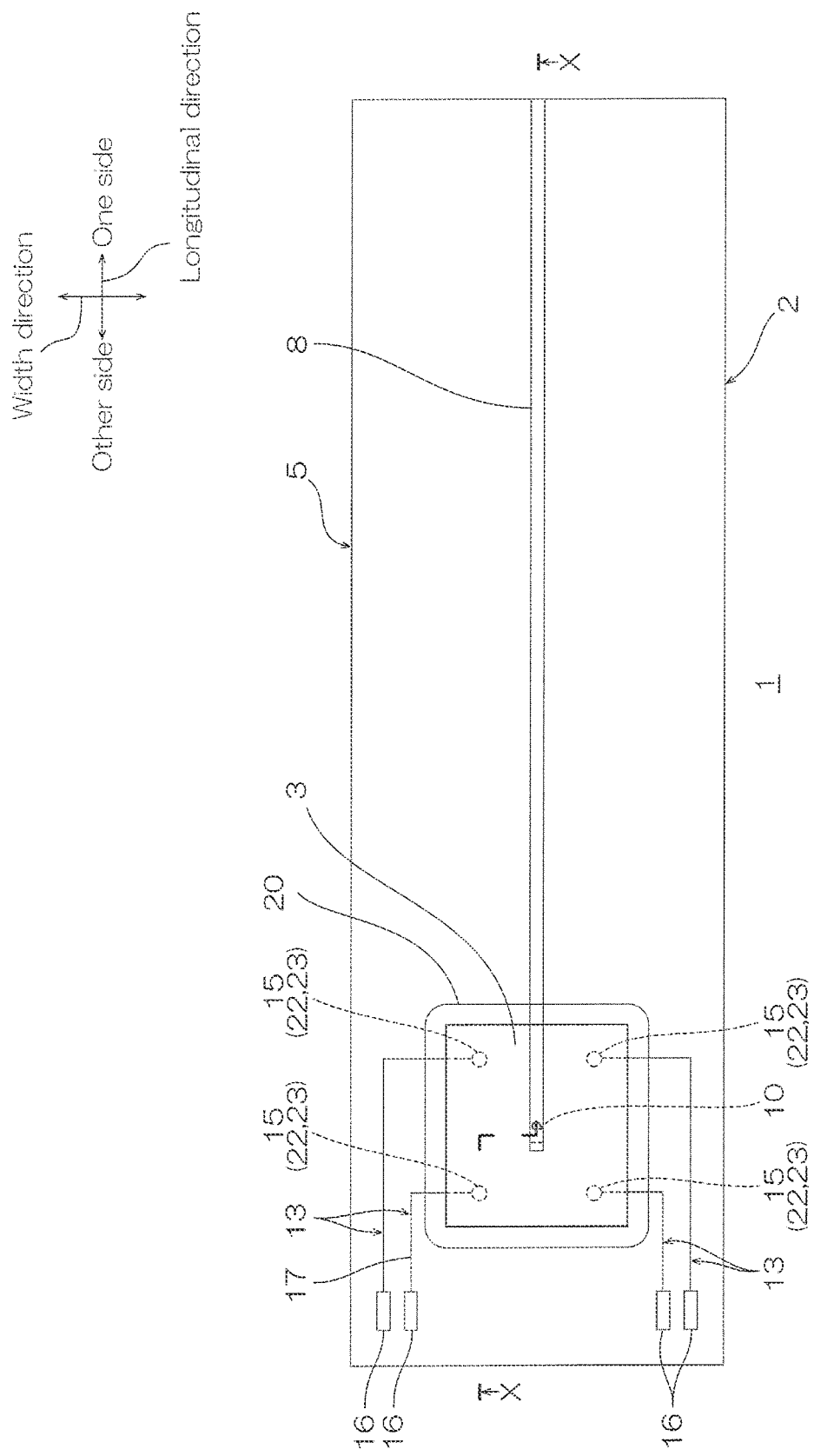
FIG. 1 shows a plan view of one embodiment of an optical element-including opto-electric hybrid board of the present invention.
Figure 2:
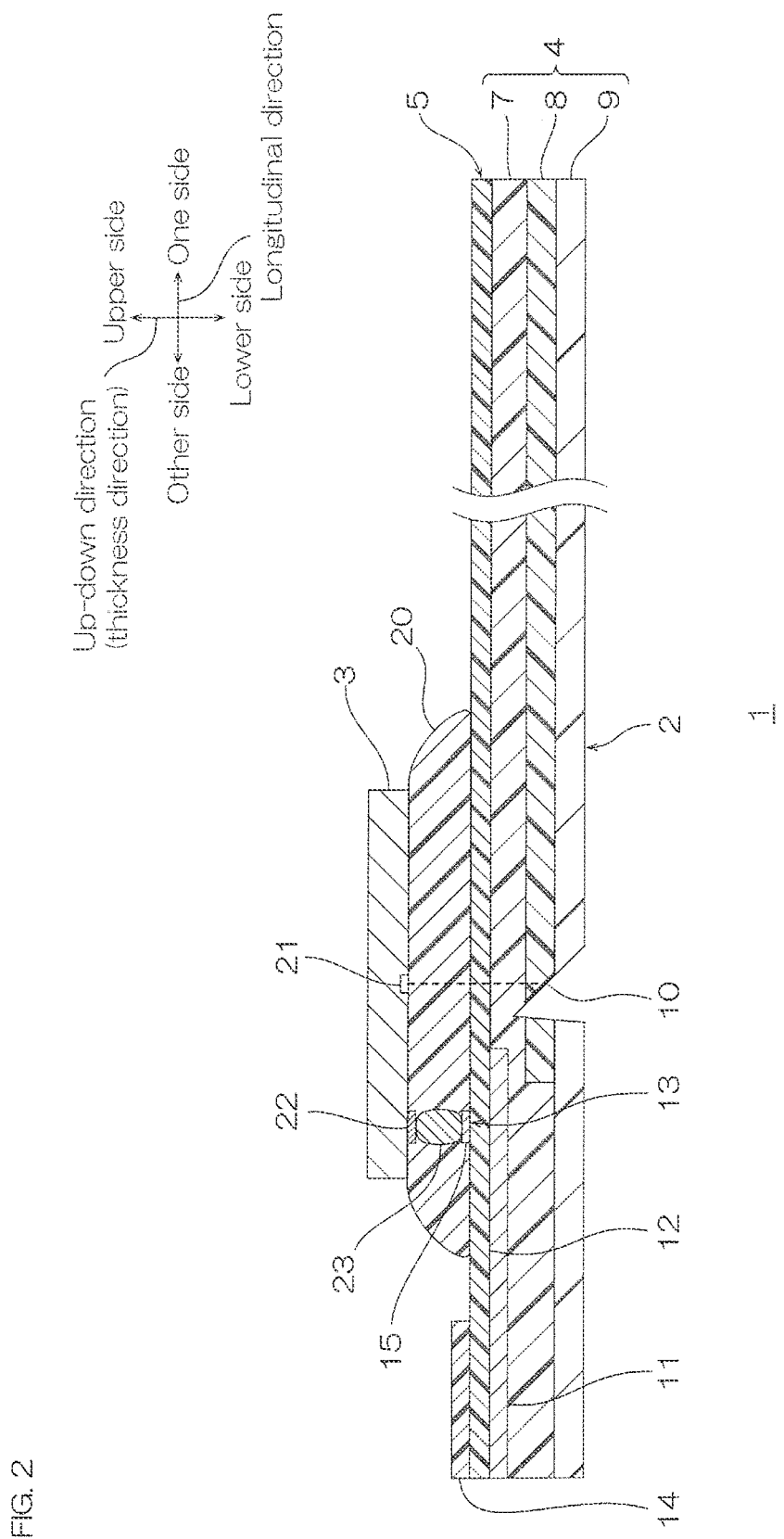
FIG. 2 shows a side cross-sectional view along an X-X line of the optical element-including opto-electric hybrid board shown in FIG. 1.

As shown in FIGS. 1 to 2, an optical element-including opto-electric hybrid board 1 includes an opto-electric hybrid board 2, an optical element 3, and a bonding member 20.

The opto-electric hybrid board 2 has a generally rectangular sheet shape extending along a longitudinal direction. The opto-electric hybrid board 2 includes an optical waveguide 4 and an electric circuit board 5 in order upwardly (toward one side in a thickness direction).

The optical waveguide 4 has the same shape when viewed from the top as the opto-electric hybrid board 2. The optical waveguide 4 includes an under clad 7, a core 8 disposed under the under clad 7, and an over clad 9 disposed under the under clad 7 so as to cover the core 8.

The core 8 extends along the longitudinal direction of the optical waveguide 4. Further, a shape in a front cross-sectional view of the core 8 is, for example, a generally rectangular shape. One end surface in the longitudinal direction of the core 8 is flush with one end surface in the longitudinal direction of the under clad 7 and the over clad 9. A mirror 10 is formed in the other end surface in the longitudinal direction of the core 8. The mirror 10 is inclined so that an angle formed between the mirror 10 and the lower surface of the under clad 7 is 45 degrees in a side cross-sectional view.

Examples of a material for the optical waveguide 4 include transparent materials such as epoxy resins, acrylic resins, and silicone resins. Preferably, from the viewpoint of heat resistance and optical signal transmissibility, an epoxy resin is used.

A size of the optical waveguide 4 is appropriately set.

A thermal expansion coefficient of the optical waveguide 4 is, for example, above 50 ppm, preferably 60 ppm or more, and for example, 110 ppm or less, preferably 90 ppm or less. A measurement method of the thermal expansion coefficient of the optical waveguide 4 is the same as that of the bonding member 20 to be described later.

The electric circuit board 5 is disposed on the upper surface of the optical waveguide 4. Specifically, the electric circuit board 5 is in contact with the entire upper surface of the optical waveguide 4. The electric circuit board 5 includes a metal support layer 11, a base insulating layer 12, a conductive layer 13, and a cover insulating layer 14.

The metal support layer 11 is provided in an area corresponding to at least a first terminal 15 (described later). The metal support layer 11 is deviated from the mirror 10 when projected in an up-down direction. Examples of a material for the metal support layer 11 include metal materials such as stainless steel.

The base insulating layer 12 is disposed on the upper surface of the metal support layer 11, and on the upper surface of the under clad 7 in which the metal support layer 11 is not provided. Examples of a material for the base insulating layer 12 include insulating materials such as polyimide.

The conductive layer 13 includes the first terminal 15, a second terminal 16, and a wiring 17.

The first terminal 15 is disposed around the mirror 10 when projected in the up-down direction. The plurality of first terminals 15 are disposed in alignment at spaced intervals to each other in the longitudinal direction and a width direction (direction perpendicular to the longitudinal direction and the thickness direction). A shape when viewed from the top of each of the plurality of first terminals 15 is not particularly limited.

The plurality of second terminals 16 are disposed in alignment at spaced intervals to each other in the width direction at the other end portion in the longitudinal direction of the base insulating layer 12. The second terminal 16 is spaced apart from the first terminal 15 at the other side in the longitudinal direction thereof.

The wiring 17 connects each of the plurality of first terminals 15 to each of the plurality of second terminals 16. The plurality of wirings 17 are disposed at spaced intervals to each other.

Examples of a material for the conductive layer 13 include conductive materials such as copper.

The cover insulating layer 14 is disposed on the upper surface of the base insulating layer 12 so as to cover the wiring 17 (not drawn in FIGS. 1 to 2). A material for the cover insulating layer 14 is the same as the material for the base insulating layer 12.

As the electric circuit board 5, a known one is used. A size of the electric circuit board 5 is appropriately set.

A thermal expansion coefficient of the electric circuit board 5 is, for example, 5 ppm or more, preferably 10 ppm or more, and for example, 50 ppm or less, preferably 25 ppm or less. A measurement method of the thermal expansion coefficient of the electric circuit board 5 is the same as that of the bonding member 20 to be described later.

Further, the thermal expansion coefficient of the electric circuit board 5 is lower than that of the optical waveguide 4, and specifically, a ratio (thermal expansion coefficient of the electric circuit board 5/thermal expansion coefficient of the optical waveguide 4) of the thermal expansion coefficient of the electric circuit board 5 to the thermal expansion coefficient of the optical waveguide 4 is, for example, 0.5 or less, further 0.4 or less, further 0.3 or less, and for example, 0.1 or more.

The thermal expansion coefficient of the electric circuit board 5 is obtained by actually measuring the electric circuit board 5 itself, or can be also calculated by proportionally dividing the thermal expansion coefficient of each of the metal support layer 11, the base insulating layer 12, the conductive layer 13, and the cover insulating layer 14 by a thickness ratio.

The optical element 3 is mounted on the opto-electric hybrid board 2. The optical element 3 is disposed at the upper side of the electric circuit board 5 at spaced intervals thereto in the central portion of the other end portion in the longitudinal direction of the electric circuit board 5. The optical element 3 has a generally box shape having a length in the up-down direction shorter than that in the longitudinal direction and that in the width direction. The optical element 3 has a size when viewed from the top smaller than the opto-electric hybrid board 2. Specifically, the optical element 3 has a size including the plurality of first terminals 15 when projected in the up-down direction. The lower surface of the optical element 3 is parallel to the upper surface of the opto-electric hybrid board 2. The optical element 3 independently includes an inlet and outlet 21 and a third terminal 22 on its lower surface.

The inlet and outlet 21 is oppositely disposed with respect to the mirror 10. The inlet and outlet 21 is an exit of light capable of emitting light from the optical element 3 to the mirror 10, or is an entrance of light capable of receiving light from the mirror 10.

The third terminal 22 is oppositely disposed with respect to the first terminal 15. The plurality of third terminals 22 are disposed in alignment at spaced intervals to each other in the longitudinal direction and the width direction on the lower surface of the optical element 3. Each of the plurality of third terminals 22 is provided corresponding to each of the plurality of first terminals 15. The third terminal 22 is electrically connected to the first terminal 15 via an electrically conductive member 23 (described later). The electrically conductive member 23 is, for example, a bump, and examples of a material thereof include metals such as gold and solder.

Specifically, examples of the optical element 3 include a laser diode (LD) and a light emitting diode (LED) capable of emitting light from the inlet and outlet 21 by receiving an input of electricity from the first terminal 15, and a photodiode (PD) outputting an electrical signal to the first terminal 15 by receiving light from the mirror 10.

The bonding member 20 is interposed between the electric circuit board 5 and the optical element 3, and bonds the electric circuit board 5 to the optical element 3. The bonding member 20 is referred to as an underfill member. Specifically, the bonding member 20 covers at least the first terminal 15 on the upper surface of the electric circuit board 5, while covering the entire lower surface of the optical element 3, and furthermore, is disposed so as to include a region overlapped with the optical element 3 and a region of the outer vicinity thereof on projecting the optical element 3 and the electric circuit board 5 when viewed from the top. The bonding member 20 covers the peripheral side surfaces of the plurality of electrically conductive members 23.

An example of a material for the bonding member 20 includes a liquid curable composition (referred to as an underfill material) containing a curable resin.

Examples of the curable resin include a thermosetting resin which can be cured by heating, a thermo-photocurable resin which can be cured by heating and application of light (active energy ray), a photocurable resin which can be cured by application of light, and a moisture-curable resin. These may be used alone or in combination of two or more. The kind of the curable resin described above is not sharply distinguished.

Examples of the curable resin include epoxy resins, silicone resins, urethane resins, polyimide resins, urea resins, melamine resins, and unsaturated polyester resins. These may be used alone or in combination of two or more. When the curable resin includes the epoxy resin, the curable composition is referred to as an epoxy resin composition.

Examples of the epoxy resin include bifunctional epoxy resins and polyfunctional epoxy resins such as bisphenol A-type epoxy resins, bisphenol F-type epoxy resins, bisphenol S-type epoxy resins, brominated bisphenol A-type epoxy resins, hydrogenated bisphenol A-type epoxy resins, bisphenol AF-type epoxy resins, biphenyl-type epoxy resins, naphthalene-type epoxy resins, fluorene-type epoxy resins, phenol novolac-type epoxy resins, ortho-cresol novolac-type epoxy resins, trishydroxyphenyl methane-type epoxy resins, and tetraphenylol ethane-type epoxy resins. Examples of the epoxy resin also include hydantoin-type epoxy resins, trisglycidyl isocyanurate-type epoxy resins, and glycidylamine type-epoxy resins. These may be used alone or in combination of two or more.

Examples of the silicone resin include straight silicone resins such as methyl silicone resins, phenyl silicone resins, and methylphenyl silicone resins, and modified silicone resins such as alkyd-modified silicone resins, polyester-modified silicone resins, urethane-modified silicone resins, epoxy-modified silicone resins, and acrylic-modified silicone resins. These may be used alone or in combination of two or more.

When the curable composition is the epoxy resin composition, the curable composition may further contain, for example, a curing agent such as an imidazole compound and an amine compound. Further, the curable composition may contain, for example, a curing accelerator such as a urea compound, a tertiary amine compound, a phosphorus compound, a quaternary ammonium salt compound, and an organic metal salt compound.

In addition, when the curable resin is the thermo-photocurable resin or the photocurable resin, the curable composition may contain, for example, a photoinitiator.

Further, the curable composition may contain a reactive monomer.

Further, the curable composition may also contain a filler in addition to the description above.

The filler is not particularly limited, and examples thereof include inorganic fillers such as aluminum hydroxide, magnesium hydroxide, calcium carbonate, magnesium carbonate, quartz glass, talc, silica, aluminum nitride, silicon nitride, and boron nitride and organic fillers such as acrylic resin particles and silicone resin particles.

The curable composition may further contain an additive such as a thermoplastic resin (acrylic resin and the like), a coupling agent, and a lubricant at an appropriate ratio.

A ratio of each component in the curable composition is appropriately set in accordance with its application and purpose. A ratio of the curable resin in the curable composition is, for example, 50% by mass or more, and 90% by mass or less. A ratio of the curing agent in the curable composition is, for example, 1% by mass or more, and for example, 40% by mass or less. A ratio of the curing accelerator in the curable composition is, for example, 0.5% by mass or more, and for example, 10% by mass or less. A ratio of the reactive monomer in the curable composition is, for example, 1% by mass or more, and 10% by mass or less. A ratio of the filler in the curable composition is, for example, 1% by mass or more, and 40% by mass or less.

The viscosity at 25° C. of the above-described material (curable composition) (A-stage) is, for example, 0.1 Pa·s or more, and for example, 25 Pa·s or less, preferably 10 Pa·s or less, more preferably 5 Pa·s or less.

When the viscosity at 25° C. of the material is the above-described upper limit or less, it is possible to smoothly and reliably pour the material between the optical element 3 and the electric circuit board 5, and thus, to suppress a decrease in the mechanical strength of the bonding member 20.

When the viscosity at 25° C. of the material is the above-described lower limit or more, it is possible to suppress the flowing of the material to the outside of the optical element 3 to contaminate its periphery.

The viscosity of the material is, for example, determined with an EHD-type viscometer.

As a material, a commercially available product can be used, and specifically, examples thereof include Z-591-Y4 manufactured by Aica Kogyo Co., Ltd., Z-591-Y6 manufactured by Aica Kogyo Co., Ltd., 3553-HM manufactured by Electronic Materials, Inc., and 8776-LS1 manufactured by Kyoritsu Chemical & Co., Ltd.

The bonding member 20 is a cured product of the curable composition described above. Specifically, examples of the bonding member 20 include a cured product obtained by heating of the material, a cured product obtained by heating of the material and application of light, a cured product obtained by application of light to the material, and a cured product obtained by moisture curing of the material. Preferably, a cured product obtained by heating of the material, and a cured product obtained by heating of the material and application of light are used.

A thermal expansion coefficient of the bonding member 20 is 80 ppm or less, preferably 60 ppm or less, more preferably 40 ppm or less, further more preferably 30 ppm or less. Further, the thermal expansion coefficient of the bonding member 20 is, for example, 1 ppm or more, further 10 ppm or more.

When the thermal expansion coefficient of the bonding member 20 is above the above-described upper limit, the mechanical strength of the bonding member 20 at a high temperature based on the heat generation of the optical element 3 decreases, and thus, the electrical connection reliability between the optical element 3 and the electric circuit board 5 decreases.

Further, when the thermal expansion coefficient of the bonding member 20 is the above-described lower limit or more, it is possible to decrease the stress applied to the bonding member 20.

On the other hand, a difference in the thermal expansion coefficient between the bonding member 20 and the optical waveguide 4 is, for example, 40 ppm or less, preferably 30 ppm or less, more preferably 20 ppm or less, and 0 ppm or more.

In the opto-electric hybrid board 2, usually, the thermal expansion coefficient of the optical waveguide 4 is larger than the thermal expansion coefficient of the electric circuit board 5. In the optical element-including opto-electric hybrid board 1 with the above-described difference small, that is, in the optical element-including opto-electric hybrid board 1 including the bonding member 20 with the thermal expansion coefficient thereof close to that of the optical waveguide 4, the bonding member 20 and the optical waveguide 4 with the small difference in the thermal expansion coefficient are disposed at both upper and lower sides of the electric circuit board 5 with the small thermal expansion coefficient, so that it is possible to effectively suppress the deformation of the region corresponding to the optical element 3 at a high temperature based on the heat generation of the optical element 3. Therefore, it is possible to suppress the warpage of the opto-electric hybrid board 2.

The thermal expansion coefficient of the bonding member 20 is measured by thermomechanical analysis (TMA).

A tensile elastic modulus (Young's modulus) at 25° C. of the bonding member 20 is, for example, 0.01 GPa or more, preferably 0.5 GPa or more, preferably 2 GPa or more, and for example, 20 GPa or less, preferably 15 GPa or less, more preferably 10 GPa or less, further more preferably 5 GPa or less.

When the tensile elastic modulus of the bonding member 20 is the above-described lower limit or more, it is possible to suppress a decrease in the mechanical strength of the bonding member 20, and thus, to suppress a decrease in the electrical connection reliability of the optical element 3 and the electric circuit board 5.

When the tensile elastic modulus of the bonding member 20 is the above-described upper limit or less, the bonding member 20 has excellent toughness.

The tensile elastic modulus of the bonding member 20 is measured in conformity with JIS K 7127 (1999).

A glass transition temperature of the bonding member 20 is, for example, 0° C. or more, preferably 30° C. or more, more preferably 75° C. or more, further more preferably above 85° C., and for example, 150° C. or less.

When the glass transition temperature of the bonding member 20 is above the above-described lower limit, it is possible to suppress a decrease in the mechanical strength of the bonding member 20 at a high temperature based on the heat generation of the optical element 3.

The glass transition temperature of the bonding member 20 is calculated as a peak value of tan δ obtained by the dynamic viscoelasticity measurement at a frequency of 1 Hz and a temperature rising rate of 5° C./min in the shear mode.

Next, a method for producing the optical element-including opto-electric hybrid board 1 is described.

First, in this method, each of the opto-electric hybrid board 2 and the optical element 3 is prepared by a known method.

Then, in this method, the electrically conductive member 23 is disposed on the upper surface of the first terminal 15.

Then, the optical element 3 is oppositely disposed with respect to the electric circuit board 5 so that the third terminal 22 is in contact with the upper end of the electrically conductive member 23. At this time, the electric circuit board 5 is disposed on the opto-electric hybrid board 2 so that a distance between the lower surface of the optical element 3 and the upper surface of the electric circuit board 5 is, for example, 1 μm or more, further 5 μm or more, and for example, 30 μm or less, preferably 10 μm or less.

Subsequently, the material for the bonding member 20 (specifically, a liquid curable composition) (curable composition in an A-stage state) is poured between the electric circuit board 5 and the optical element 3.

Thereafter, the material is, for example, cured.

Specific examples of a curing method include heating, heating and application of light, application of light, and standing under a moisture atmosphere. Preferably, heating only is used, preferably, a combination of heating and application of light is used.

Examples of the light include ultraviolet rays.

Thus, the material is cured to form the bonding member 20 which is a cured product thereof. The optical element 3 is bonded (adhered) to the electric circuit board 5 by the bonding member 20.

Also, at the same time as or before and after the curing of the material, by reflowing the electrically conductive member 23, the first terminal 15 is electrically connected to the third terminal 22. The electrically conductive member 23 is reinforced by the bonding member 20.

Thus, the optical element-including opto-electric hybrid board 1 including the opto-electric hybrid board 2, the optical element 3, and the bonding member 20 bonding these is obtained.

Then, in the optical element-including opto-electric hybrid board 1, since the thermal expansion coefficient of the bonding member 20 is 80 ppm or less, it is possible to suppress a decrease in the mechanical strength of the bonding member 20 at a high temperature based on the heat generation of the optical element 3, and to suppress a decrease in the electrical connection reliability.

Further, in the optical element-including opto-electric hybrid board 1, since the thermal expansion coefficient of the bonding member 20 is 10 ppm or more, it is possible to decrease the stress applied to the bonding member 20.

Further, in the optical element-including opto-electric hybrid board 1, when the material for the bonding member 20 has the viscosity at 25° C. of 10 Pa·s or less, it is possible to smoothly and reliably pour the material between the optical element 3 and the electric circuit board 5, and thus, to suppress a decrease in the mechanical strength of the bonding member 20. Further, when the viscosity at 25° C. of the material is 0.1 Pa·s or more, it is possible to suppress the flowing of the material to the outside of the optical element 3 to contaminate its periphery on pouring the material between the optical element 3 and the electric circuit board 5.

Furthermore, in the optical element-including opto-electric hybrid board 1, when the tensile elastic modulus at 25° C. of the bonding member 20 is 0.5 GPa or more, it is possible to suppress a decrease in the mechanical strength of the bonding member 20, and thus, to suppress a decrease in the electrical connection reliability of the optical element 3 and the electric circuit board 5. On the other hand, when the tensile elastic modulus at 25° C. of the bonding member 20 is 15 GPa or less, the bonding member 20 has excellent toughness.

Further, when the glass transition temperature of the bonding member 20 is above the above-described 85° C., it is possible to suppress a decrease in the mechanical strength of the bonding member 20 even at a high temperature based on the heat generation of the optical element 3.

In the optical element-including opto-electric hybrid board 1, when the material for the bonding member 20 contains a curable composition such as a thermosetting resin or a thermo-photocurable resin, it is possible to form the bonding member 20 in a short time by heating of these or by heating and application of an active energy ray.

Modified Examples

In each modified example below, the same reference numerals are provided for members and steps corresponding to each of those in the above-described one embodiment, and their detailed description is omitted. Each modified example can achieve the same function and effect as that of one embodiment unless otherwise specified. Furthermore, one embodiment and the modified example thereof can be appropriately used in combination.

In one embodiment, though the material for the bonding member 20 is described as being liquid. However, the state of the material for the bonding member 20 is not limited to this, and may be, for example, solid or semi-solid.

EXAMPLES

Next, the present invention is further described based on Examples and Comparative Example below. The present invention is however not limited by these Examples and Comparative Example. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Examples 1 to 4 and Comparative Example 1

The optical element-including opto-electric hybrid board 1 was fabricated based on one embodiment.

An epoxy resin, an acrylic resin, and a filler were appropriately blended to prepare a material for the bonding member 20. The material was used as a cured product by heating at 100° C. for three hours to form each of the bonding members 20 of Examples 1 to 4 and Comparative Example 1.

Evaluation of Properties

The following properties were evaluated. The results are described in Table 1.

[Optical Waveguide, Electric Circuit Board, and Thermal Expansion Coefficient of Bonding Member]

A thermal expansion coefficient of the bonding member 20 was measured by TMA. In addition, the thermal expansion coefficient of the optical waveguide 4 and the thermal expansion coefficient of the electric circuit board 5 were obtained, and the results of each of them were 75 ppm and 18 ppm.

[Viscosity of Material for Bonding Member]

The viscosity at 25° C. of the material for the bonding member 20 was measured with an EHD-type viscometer.

[Tensile Elastic Modulus of Bonding Member]

A tensile elastic modulus (Young's modulus) at 25° C. of the bonding member 20 was determined in conformity with JIS K 7127 (1999).

[Glass Transition Temperature of Bonding Member]

A glass transition temperature of the bonding member 20 was calculated as a peak value of tan δ obtained from the dynamic viscoelasticity measurement at a frequency of 1 Hz and a temperature rising rate of 5° C./min in the shear mode.

[Mechanical Strength of Bonding Member]

The mechanical strength of the bonding member 20 was obtained as the peel strength at the time of peeling the optical element 3 from the opto-electric hybrid board 2. Specifically, the peel strength was measured by a die share test.

[Non-Defective Ratio of Optical Element-Including Opto-Electric Hybrid Board]

100 optical element-including opto-electric hybrid boards 1 were fabricated, and a heat resistance test of heating them at 85° C. for 10 hours was carried out. The optical element 3 and the electric circuit board 5 in the optical element-including opto-electric hybrid board 1 after the test were subjected to an electrically conductive test, and a ratio (non-defective ratio) of an acceptable product was determined.

TABLE 1

| Example/Comparative Example | | | Ex. 1 | Ex. 2 | Ex. 3 | Ex. 4 | Comparative Ex. 1 |
|---|---|---|---|---|---|---|---|
| Material of Bonding Member | Viscosity at 25° C. | (Pa·s) | 0.5 | 1 | 1 | 21 | 21 |
| Properties of Bonding Member | Thermal Expansion Coefficient | (ppm) | 20 | 50 | 50 | 50 | 85 |
| | Tensile Elastic Modulus at 25° C. | (GPa) | 2.6 | 2.6 | 0.1 | 0.1 | 0.1 |
| | Glass Transition Temperature | (° C.) | 100 | 20 | 20 | 20 | 20 |
| | Mechanical Strength | (MPa) | 213 | 250 | 250 | 250 | 300 |
| Result | Non-Defective Ratio of Optical Element-Including Opto-Electric Hybrid Board | (%) | 95 | 90 | 80 | 65 | 40 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The optical element-including opto-electric hybrid board of the present invention is, for example, used for communication and the like.

DESCRIPTION OF REFERENCE NUMBER

1 Optical element-including opto-electric hybrid board
2 Opto-electric hybrid board
3 Optical element
4 Optical waveguide
5 Electric circuit board
20 Bonding member

The invention claimed is:

1. An optical element-including opto-electric hybrid board comprising:
   an optical waveguide,
   an electric circuit board disposed on an upper surface of the optical waveguide in a thickness direction of the opto-electric hybrid board,
   an optical element disposed at an upper side of the electric circuit board in the thickness direction, and
   a bonding member separated from the optical waveguide by the electric circuit board in the thickness direction, and interposed between the optical element and the electric circuit board so as to bond the optical element to the electric circuit board,
   wherein a thermal expansion coefficient of the optical waveguide is above 50 ppm/° C. and 110 ppm/° C. or less,
   wherein a thermal expansion coefficient of the bonding member is more than 20 ppm/° C. and 80 ppm/° C. or less, and
   wherein a difference in the thermal expansion coefficient between the bonding member and the optical waveguide is 30 ppm/° C. or less.

2. The optical element-including opto-electric hybrid board according to claim 1, wherein
   a material for the bonding member has the viscosity at 25° C. of 0.1 Pa·s or more and 10 Pa·s or less.

3. The optical element-including opto-electric hybrid board according to claim 1, wherein
   a tensile elastic modulus at 25° C. of the bonding member is 0.5 GPa or more and 15 GPa or less.

4. The optical element-including opto-electric hybrid board according to claim 1, wherein
   a glass transition temperature of the bonding member is above 85° C.

5. The optical element-including opto-electric hybrid board according to claim 1, wherein
   the bonding member is a cured product obtained by heating of the material, or a cured product obtained by heating of the material and by application of an active energy ray.

* * * * *